United States Patent
Que et al.

(10) Patent No.: US 8,994,898 B2
(45) Date of Patent: Mar. 31, 2015

(54) COF BASE TAPE AND MANUFACTURING METHOD THEREOF AND LIQUID CRYSTAL DISPLAY MODULE COMPRISING SAME

(71) Applicant: Shenzhen China Star Optoelectronics Technology Co., Ltd., Shenzhen, Guangdong (CN)

(72) Inventors: Chengwen Que, Shenzhen (CN); Dehua Li, Shenzhen (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 182 days.

(21) Appl. No.: 13/701,529

(22) PCT Filed: Oct. 31, 2012

(86) PCT No.: PCT/CN2012/083843
§ 371 (c)(1),
(2) Date: Dec. 3, 2012

(87) PCT Pub. No.: WO2014/059700
PCT Pub. Date: Apr. 24, 2014

(65) Prior Publication Data
US 2014/0111729 A1   Apr. 24, 2014

(30) Foreign Application Priority Data

Oct. 18, 2012  (CN) .......................... 2012 1 0397127

(51) Int. Cl.
*G02F 1/1333* (2006.01)
*G02F 1/133* (2006.01)
*G02F 1/1345* (2006.01)
*H05K 1/02* (2006.01)
*H05K 3/36* (2006.01)

(52) U.S. Cl.
CPC ....... *G02F 1/1345* (2013.01); *Y10T 428/24802* (2015.01); *G02F 1/13452* (2013.01); *H05K 1/0269* (2013.01); *H05K 3/361* (2013.01); *H05K 2201/0108* (2013.01); *H05K 2201/09918* (2013.01); *H05K 2203/166* (2013.01)
USPC ............................... 349/94; 349/73; 349/158

(58) Field of Classification Search
CPC ................ G02F 1/1345; G02F 1/1334; G02F 2001/13347; G09G 19/544
USPC .............................................. 349/94, 73, 158
See application file for complete search history.

(56) References Cited

U.S. PATENT DOCUMENTS

| | | | |
|---|---|---|---|
| 6,657,606 B2 * | 12/2003 | Kang et al. ...................... | 345/87 |
| 7,514,802 B2 * | 4/2009 | Tetani et al. .................. | 257/797 |
| 7,750,457 B2 * | 7/2010 | Seko ............................. | 257/688 |
| 8,203,684 B2 * | 6/2012 | Uehara ......................... | 349/152 |

* cited by examiner

*Primary Examiner* — Mike Qi
(74) *Attorney, Agent, or Firm* — Andrew C. Cheng

(57) ABSTRACT

The present invention provides a COF base tape. The COF base tape includes: a connected lead being configured to connect with a connected terminal of a liquid crystal glass; an alignment mark being set on the two sides of the connected lead being configured to align with a mark of the connected terminal, an area of the alignment mark thereof being light transparency. The present invention also provides a method for manufacturing the COF base tape and liquid crystal display module. The embodiment of the invention of a COF base tape and manufacturing method thereof and liquid crystal display module including the same enhances the strength of the COF base tape edge and raises the accurate alignment and operationally of the COF base tap connected with liquid glass. The present invention can save the material and reduce the cost of the art.

8 Claims, 3 Drawing Sheets

COF BASE TAPE AND MANUFACTURING METHOD THEREOF AND LIQUID CRYSTAL DISPLAY MODULE COMPRISING SAME

This application claims priority to China Patent Application No. 201210397127.2 filed on Oct. 18, 2012, the invention title "COF BASE TAPE AND MANUFACTURING METHOD THEREOF AND LIQUID CRYSTAL DISPLAY MODULE COMPRISING SAME" the disclosures of which are incorporated herein by reference in their entirety.

BACKGROUND OF THE INVENTION

1. Field of the Invention

The present invention relates to a liquid display field, and more particularly, to a COF base tape and manufacturing method and liquid crystal display module.

2. Descriptions of the Related Art

COF (Chip On Film) is widely used in liquid display field. COF base tape is usually mounted on the driver of the liquid display device to be configured to drive the liquid crystal device.

However, COF connected to liquid glass needs high accurate connected. Therefore the two sides of the COF and liquid glass connected place are set up alignment mark separately to be configured to make sure COF base tape whether to align with the liquid glass accurately that is need.

As shown in FIG. 6, FIG. 6 is a schematic view of the COF base tape in prior art. The prior art COF base 9 is usually used the copper layer as the alignment mark. The structure of the COF edge exiting the problem is:

1. The strength of the COF edge is low and usually the COF edges often peel off and roll up.
2. The alignment mark 91 surface is covered over the copper and is difficult to identify the mark of the liquid glass and caused the difficult to align.

SUMMARY OF THE INVENTION

The technical issue to be addressed by the present invention is to provide a COF base tape and manufacturing method thereof and liquid crystal display module including the same to enhance the strength of the COF base tape edge and raises the accurate alignment and operationally of the COF base tap connected with liquid glass. The present invention can save the material and reduce the cost of the art.

To solve the above technical problem, this invention is adopted the technical solution to provide a COF base tape, wherein, the COF base tape at least comprising:

A connected lead being configured to connect with a connected terminal of a liquid crystal glass;

An alignment mark being set on the two sides of the connected lead being configured to align with a mark of the connected terminal, an area of the alignment mark thereof being light transparency;

The alignment mark on any side of the connected lead at least being set up one thereon.

Wherein, the surrounding of the alignment mark is laid a copper layer in order to enhance the strength of the COF base tape.

Wherein, the shape of each of the alignment mark is a circle, a cross, a triangle, trapezoid or a T-shaped.

Wherein the alignment marks on any side of the connected lead are set up two thereon and one of the alignment mark shape is circle and the other of the alignment mark shape is T-shaped.

Wherein, a center of two alignment marks on any side of the connected lead is arranged on a same straight line.

Wherein, a center axis of two alignment marks on any side of the connected lead is on a same straight line.

Wherein, the alignment mark on two sides of the connected lead is arranged symmetrically.

To address the above technical issue, the present invention adopts another technical solution that provides a method for manufacturing a COF base tape, the method at least comprising the steps of: etching a metal layer of two sides of the COF base tape separately to form an alignment mark light transparently to be configured to overlay and align with a mark of a connected terminal of a liquid crystal glass.

Wherein, the metal layer is a copper layer and the step of etching the metal layer of two sides of the COF base tape separately comprises the steps of:

Etching the copper layer on any side of the COF base tape to form at least a shape of the alignment mark, the shape being a circle, a cross, a triangle, trapezoid or a T-shaped.

Wherein, etching the copper layer on two sides of the COF base tape to form the alignment mark is arranged symmetrically.

Wherein, a center axis of two alignment marks on any side of a connected lead is on a same straight line.

To solve the above technical problem, this invention is adopted another technical solution to provide a liquid crystal display module at least comprising a liquid glass and a COF base tape, the liquid glass having a connected terminal and, two sides of the connected terminal being set up a mark, the COF base tape having a connected lead being configured to connect with the connected terminal, a light transparent alignment mark being set an area on the two sides of connected lead being configured to overlay and align with a mark of the connected terminal;

Through the light transparent alignment mark aligning with a mark of the connected terminal and the connected lead of the COF base band being connected with the connected terminal of the liquid glass;

The alignment mark on any side of the connected lead at least being set up one thereon.

Wherein, the surrounding of the alignment mark is laid a copper layer in order to enhance the strength of the COF base tape.

Wherein, a shape of each of the alignment mark is a circle, a cross, a triangle, trapezoid or a T-shaped.

Wherein, the surrounding of the alignment mark is laid a copper layer in order to enhance the strength of the COF base tape.

Wherein, a shape of each of the alignment mark is a circle, a cross, a triangle, trapezoid or a T-shaped.

Wherein, the alignment marks on any side of the connected lead are set up two thereon and one of the alignment mark shape is circle and the other of the alignment mark shape is T-shaped.

Wherein, a center of two alignment marks on any side of the connected lead is arranged on a same straight line.

Wherein, a center axis of two alignment marks on any side of the connected lead is on a same straight line.

Wherein, the alignment mark on two sides of the connected lead is arranged symmetrically.

The present invention is to provide a COF base tape and manufacturing method thereof and liquid crystal display module having the efficacy result: the area of the alignment mark on two sides of connected lead is light transparency. Through the light transparent alignment mark embodies to align with a mark of the connected terminal of the liquid glass. The invention embodies the COF base tap high density connected with liquid glass and raises the accurate alignment and operationally. The surrounding of the alignment mark is laid a copper layer in order to enhance the strength of the COF base tape edge and can prevent the COF edges from peeling off and rolling up. Through etching the smaller area as the alignment mark can save the material and reduce the cost of the art.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DESCRIPTION OF THE PREFERRED EMBODIMENT

The figures and the embodiment of the present invention will be described in detail as follows.

Figure 1:
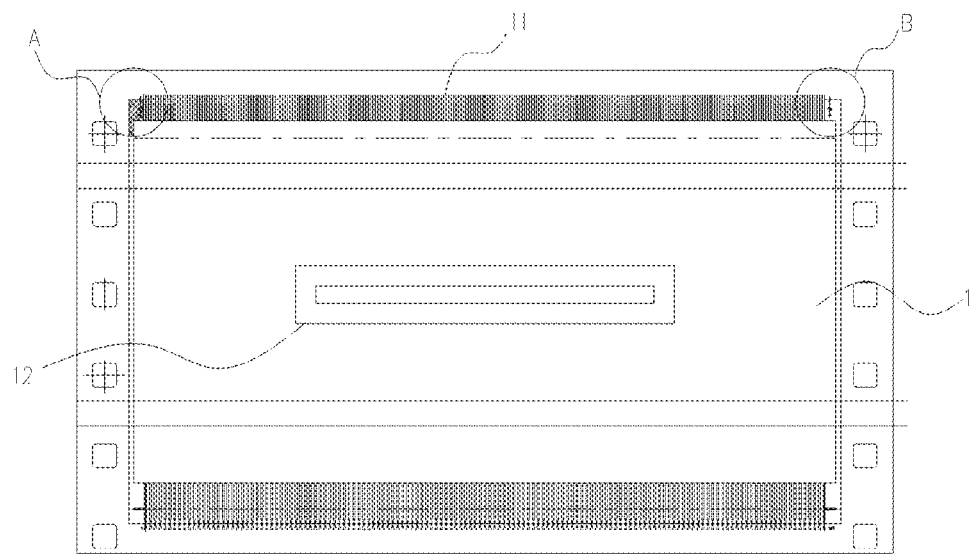
FIG. 1 is a schematic view of the COF base tape according to the present invention.
Figure 2:
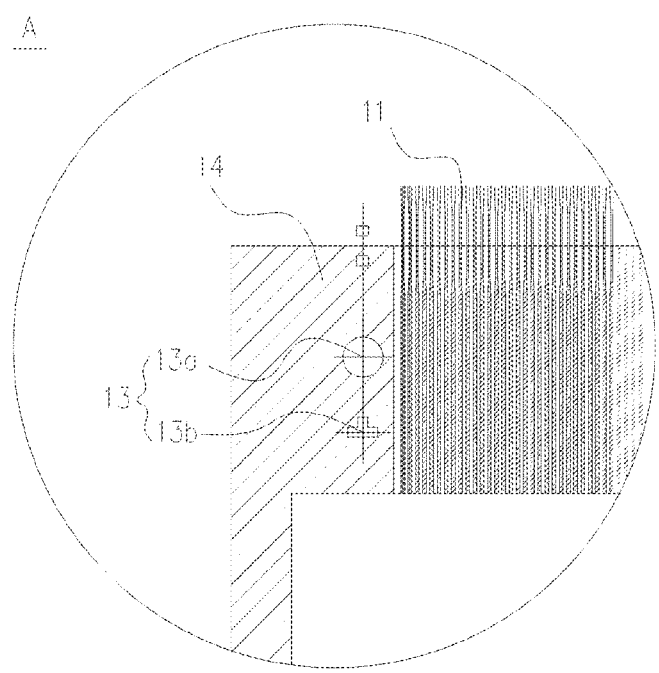
FIG. 2 is a larger schematic view of the COF base tape as shown in FIG. 1A area according to the present invention.

As shown in FIG. 1 and FIG. 2, is the first embodiment of the COF band tape. The COF band tape 1 of present invention is comprising a connected lead 11, an electric circuit chip 12 and the input terminal wire (not shown) and output terminal wire (not shown) are connected with the connected lead 11 and the electric circuit chip 12 separately.

As shown in FIG. 1, FIG. 1 is a schematic view of the COF base tape according to the present invention, wherein:

The connected leads 11 are set on the top and bottom of the COF base tape and the embodiment of the connected leads 11 can be the input terminal of the COF base tape and also can be the output terminal of the COF base tape.

The connected leads 11 through the alignment mark embodies the high density connected with liquid glass connected terminal. In this embodiment alignment marks are set on the left and right sides of the connected leads 11. The following is an example as the alignment mark on one side of the connected leads 11.

FIG. 2 is a larger schematic view of the COF base tape as shown in FIG. 1A area according to the present invention. The above the alignment marks 13 are set on two and are the circle shape alignment mark 13a and T-shaped shape alignment mark 13b separately. Two alignment marks 13a, 13b from top to bottom are on a same straight line. The area of two alignment marks 13a, 13b thereon (shown in FIG. 2 the area of circle shape and T-shaped shape) are set by light transparency;

The alignment marks 13a, 13b being set by light transparency is:

Through the light transparent area can observe clearly the bottom of the alignment mark 13a, 13b. When the connected leads 11 are connected with the connected terminal, by observing the alignment marks 13a, 13b and the located bottom mark of the connected terminals is whether align accurately and realize the accurate alignment of the COF band tape and the liquid glass.

Furthermore, the surrounding of the alignment mark 13a, 13b is laid a copper layer 14 in order to enhance the strength of the COF base tape.

The copper layer 14 set on the two sides of the connected leads 11 can prevent the COF band tape edge from peeling off, rolling up and further improve the quality of the COF band tape.

In this embodiment the connected leads 11 as shown in FIG. 1B area (right side) from top to bottom are set two same shape alignment marks 13a, 13b (not shown) as the above mentioned, the circle shape alignment mark 13a and T-shaped shape alignment mark 13b separately. The surrounding also is laid a copper layer and the functions are same with two alignment marks 13a, 13b of the area A.

A center axis of two alignment marks on each side of the connected lead 11 is set on a same straight line. The purpose of alignment marks on two sides of the connected lead 11 arranged symmetrically is:

The purpose can fast check and observe two alignment marks whether accurate alignment with a mark of the connected terminal under the alignment marks. Under not accurate alignment condition, it can fast adjust until to alignment, and improve the efficiency of connected the COF band tape with the liquid glass.

The other embodiment of present invention COF band tape, the alignment marks on two sides of the connected lead 11 can be asymmetrically. The alignment mark on each side of the connected lead 11 can be set up one or above two thereon. The shape of each alignment mark is not limited to the circle shape and T-shaped shape. It can be a cross, a triangle, trapezoid or a polygon and just satisfy to fit the shape of the mark of the connected terminal.

For example, on one side of the connected lead 11 and connected terminal are set on a cross shape alignment mark and mark separately. On the other side of the connected lead 11 and connected terminal are set on three, as circle, triangle, rectangular shape alignment mark and mark separately and it is not affected the alignment effect of the COF band tape and liquid glass.

The alignment marks 13a, 13b of the present invention can be formed through etching the copper layer 14. The embodiment is as the following the method for manufacturing a COF base tape.

A method for manufacturing a COF base tape of this invention is at least comprising the steps of:

Etching a metal layer of two sides of the COF base tape separately to form an alignment mark light transparently to be configured to overlay and align with a mark of a connected terminal of a liquid crystal glass.

In this embodiment the metal layer is a copper layer 14 that set on the two sides of the COF base tape and that is the two sides of the connected lead 11 of the COF base tape. The copper layer 14 is to enhance the strength of the COF base tape and satisfy the etching art need. Of course it can set up and replace the other metal layer having the above function.

The step of etching the metal layer used the etching area as the alignment mark can be not only get to overlay and align of the alignment mark 13a,13b and to ensure the alignment mark 13a,13b have the certain light transparency but also keep the surrounding copper layer of the alignment mark 13a,13b in maximum limit.

Furthermore, the light transparency of the alignment mark can be observed clearly through the alignment mark 13a, 13b and the mark of the connected terminal under the alignment mark 13a, 13b bottom to check whether to align accurately and realize the accurate alignment of the COF band tape and the liquid glass. Keeping the surrounding copper layer of the alignment mark enhance the strength of the COF base tape edge and can prevent the COF edges from peeling off and rolling up. Through smaller area of etching the as the alignment mark can save the material and reduce the cost of the art.

The each side of the copper layer 14 need to etch at least an alignment mark to realize the above accurate alignment of the COF band tape and the liquid glass. The alignment mark on each side can be etched two or above two thereon. The shape of each alignment mark is a circle shape, a cross, a triangle, trapezoid or a T-shaped shape and other usually shape.

Etching the copper layer 14 is configured to be a center axis of all the alignment marks on each side of the copper layer 14 on a same straight line. The purpose of etching the alignment marks on two sides copper layer of the COF base tape symmetrically is:

The purpose through etching the alignment marks can fast check and observe a mark of the connected terminal under the alignment marks. Under not accurate alignment condition, it can fast adjust until to alignment and improve the efficiency of connected the COF band tape with the liquid glass.

Figure 3:
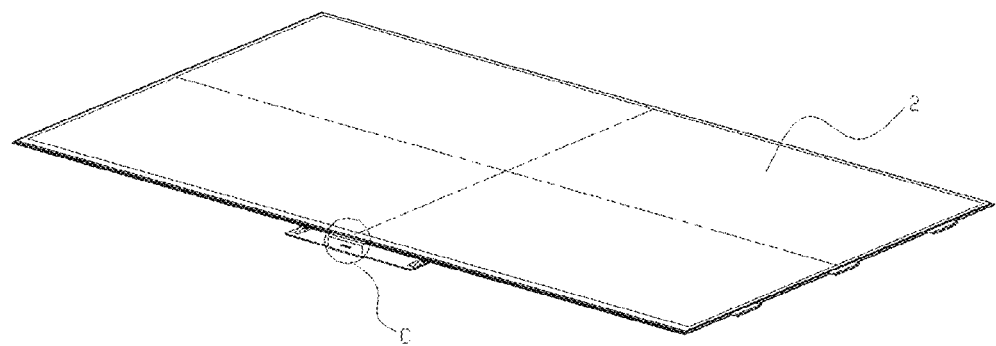
FIG. 3 is a schematic view of a liquid crystal display module according to the present invention.

The present invention disclosures a liquid crystal display module, the liquid crystal display module comprising a COF base 1 tape and a liquid glass 2. As shown in FIG. 3 is a schematic view of a liquid crystal display module according to the present invention. The liquid crystal 2 as shown in FIG. 3 C area was set on the connected terminal and the COF base through connected leads 11 and connected terminal connected with liquid glass to embody the high density connection.

Figure 4:
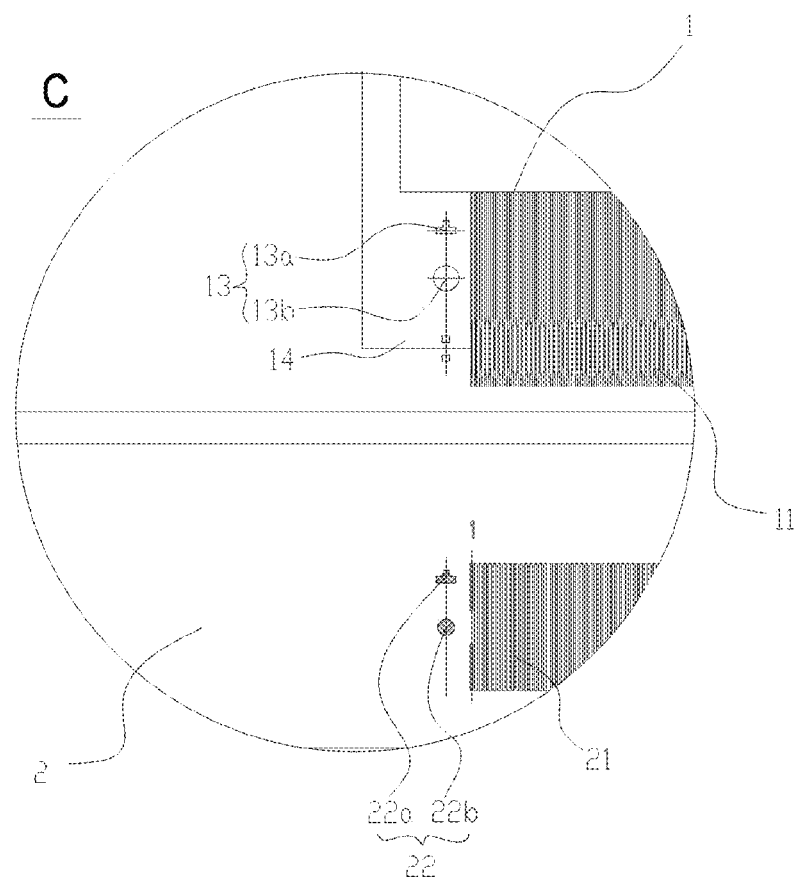
FIG. 4 is a schematic view of a liquid crystal display module as shown in FIG. 3 C area before the COF band tape connected with the liquid glass according to the present invention.

As shown in FIG. 4 is a schematic view of a liquid crystal display module as shown in FIG. 3 C area before the COF band tape connected with the liquid glass according to the present invention. Wherein, the position on two sides of the connected terminal are at least set up a mark 22 relatively corresponding to the position on two sides of the alignment mark of the COF base tape (connected terminal 21 as shown in Fig. and the right side of a mark not shown).

The shape of marks 22 corresponding to the shape of the alignment marks 13a, 13b on the COF band tape are same. In this present embodiment two marks 22a, 22b are the circle shape alignment mark 22a and T-shaped shape alignment mark 22b separately. The area of the two marks 22a, 22b are set to no light transparently and the surface area is slightly smaller than the alignment mark 13a, 13b.

Figure 5:
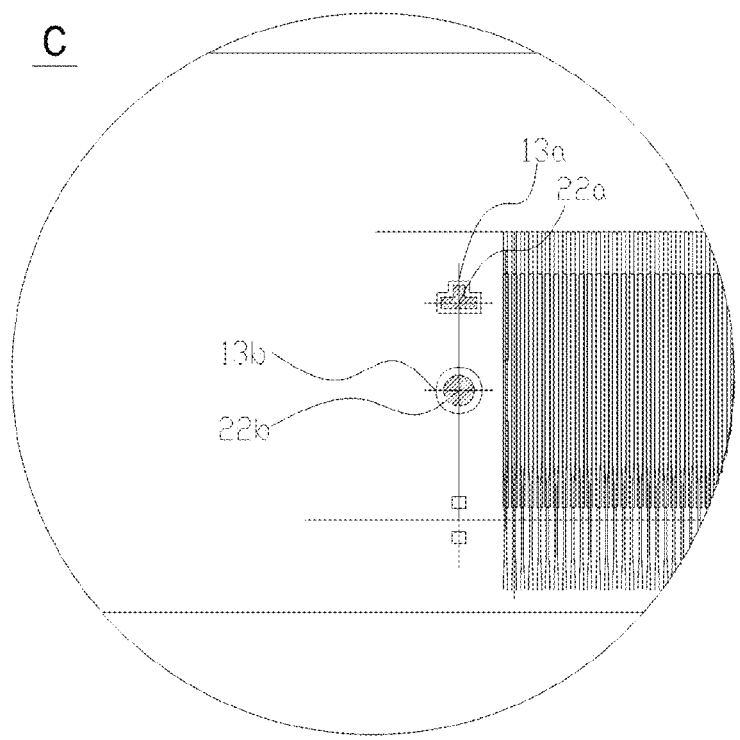
FIG. 5 is a schematic view of a liquid crystal display module as shown in FIG. 3 C area after the COF band tape connected with the liquid glass according to the present invention.
Figure 6:
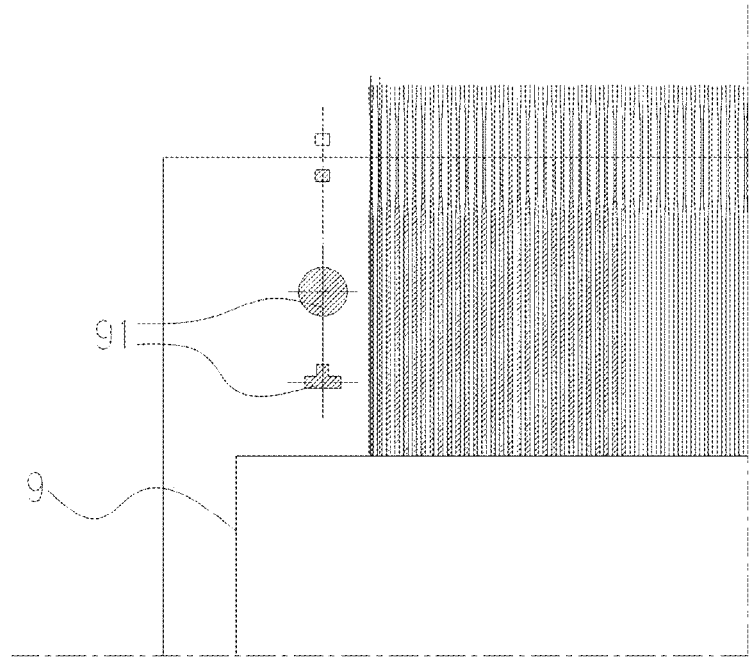
FIG. 6 is a schematic view of the COF band tape according to the prior art.

The COF band tape 1 aligns and assembles with liquid glass 2, as the FIG. 5 shown, is a schematic view of a liquid crystal display module as shown in FIG. 3 C area after the COF band tape connected with the liquid glass according to the present invention. Specifically, when the connected lead 11 is connected with connected terminal 21, through observe the alignment mark 13a, 13b and the mark 22a, 22b of the connected terminal under the alignment mark bottom to check whether to align accurately. That is the center of the alignment mark 13a and the mark 22a, the center of the alignment mark 13b and the mark 22b whether to overlay and the figure showed that the alignment mark and the mark of the right side of the connected lead 11 and the connected terminal 21 whether to overlay. When all the alignment mark 13 and the mark 22 overlay, the connected lead 11 and connected terminal 21 align accurately. Otherwise, it needs to adjust the position of the connected lead 11.

The liquid crystal display module of the present invention have the light transparent COF band tape structure mentioned above, and the embodiment is same with the COF band tape, and not repeat no more here.

The COF base tape and manufacturing method thereof and liquid crystal display module of the present invention: the area of the alignment mark on two sides of connected lead is light transparency. Through the light transparent alignment mark embodies to align with a mark of the connected terminal of the liquid glass. The invention embodies the COF base tap high density connected with liquid glass and raises the accurate alignment and operationally. The surrounding of the alignment mark is laid a copper layer in order to enhance the strength of the COF base tape edge and can prevent the COF edges from peeling off and rolling up. Through etching the smaller area as the alignment mark can save the material and reduce the cost of the art.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A liquid crystal display module at least comprising a liquid glass and a COF base tape, the liquid glass having a connected terminal and two sides of the connected terminal being set on a mark, the COF base tape having a connected lead being configured to connect with the connected terminal, wherein,
    a light transparent alignment mark being set an area on the two sides of connected lead being configured to overlay and align with a mark of the connected terminal, the light transparent alignment mark further being an etched-off region formed by etching a metal layer and surrounded by the remaining of the metal layer, the mark of the connected terminal being set to be not light transparent and having a surface area slightly smaller than the light transparent alignment mark;
    through the light transparent alignment mark aligning with a mark of the connected terminal and the connected lead of the COF base band being connected with the connected terminal of the liquid glass;
    the alignment mark on any side of the connected lead at least being set up one thereon.

2. The liquid crystal display module as claimed in claim 1, wherein, a shape of each of the alignment mark is a circle, a cross, a triangle, trapezoid or a T-shaped.

3. The liquid crystal display module as claimed in claim 1, wherein, the surrounding of the alignment mark is laid a copper layer in order to enhance the strength of the COF base tape.

4. The liquid crystal display module as claimed in claim 3, wherein, the shape of each of the alignment mark is a circle, a cross, a triangle, trapezoid or a T-shaped.

5. The liquid crystal display module as claimed in claim 4, wherein the alignment marks on any side of the connected lead are set up two thereon and one of the alignment mark shape is circle and the other of the alignment mark shape is T-shaped.

6. The liquid crystal display module as claimed in claim 5, wherein a center of two alignment marks on any side of the connected lead is arranged on a same straight line.

7. The liquid crystal display module as claimed in claim 4, wherein a center axis of two alignment marks on any side of the connected lead is on a same straight line.

8. The liquid crystal display module as claimed in claim 1, wherein the alignment mark on two sides of the connected lead is arranged symmetrically.

* * * * *